(12) United States Patent
Watanabe et al.

(10) Patent No.: US 8,867,227 B2
(45) Date of Patent: Oct. 21, 2014

(54) ELECTRONIC COMPONENT

(75) Inventors: Atsushi Watanabe, Osaka (JP); Seiji Fujiwara, Kyoto (JP)

(73) Assignee: Panasonic Corporation, Osaka (JP)

( * ) Notice: Subject to any disclaimer, the term of this patent is extended or adjusted under 35 U.S.C. 154(b) by 760 days.

(21) Appl. No.: 13/033,218

(22) Filed: Feb. 23, 2011

(65) Prior Publication Data

US 2011/0205719 A1    Aug. 25, 2011

(30) Foreign Application Priority Data

Feb. 24, 2010   (JP) .................................. 2010-039014
Dec. 17, 2010   (JP) .................................. 2010-281320

(51) Int. Cl.
*H05K 7/10*    (2006.01)
*H05K 7/12*    (2006.01)
(Continued)

(52) U.S. Cl.
CPC ....... *H01L 23/49562* (2013.01); *H01L 2224/29* (2013.01); *H01L 2924/01055* (2013.01); *H01L 2224/49171* (2013.01); *H01L 2924/14* (2013.01); *H01L 24/83* (2013.01); *H01L 2924/10329* (2013.01); *H01L 2924/014* (2013.01); *H01L 24/29* (2013.01); *H01L 2924/0132* (2013.01); *H01L 2224/2929* (2013.01); *H01L 2224/48227* (2013.01); *H01L 2224/32225* (2013.01); *H01L 2224/48091* (2013.01); *H01L 2924/0103* (2013.01); *H01L 2224/838* (2013.01); *H01L 2224/48137* (2013.01); *H01L 23/49575* (2013.01); *H01L 2924/01033* (2013.01); *H01L 2224/29101* (2013.01); *H01L 2224/29298* (2013.01); *H01L 24/48* (2013.01); *H01L 2924/01052* (2013.01);
(Continued)

(58) Field of Classification Search
USPC .......................... 361/760–782; 174/262–264
See application file for complete search history.

(56) References Cited

U.S. PATENT DOCUMENTS 5,483,421 A * 1/1996 Gedney et al. ................ 361/771
5,769,989 A * 6/1998 Hoffmeyer et al. ............. 156/94
(Continued)

FOREIGN PATENT DOCUMENTS

JP      61-65754       5/1986

*Primary Examiner* — Tuan T Dinh
(74) *Attorney, Agent, or Firm* — McDermott Will & Emery LLP

(57) ABSTRACT

An electronic component is mounted on a circuit board. The electronic component includes: a lead frame including a fixed portion, a lead portion connected to the fixed portion, and a heat-dissipating portion connected to the fixed portion; a semiconductor chip fixed on the fixed portion by a first binder; and an encapsulation resin for encapsulating the fixed portion, the semiconductor chip, and a base portion of the lead portion. A groove is provided in the fixed portion and the heat-dissipating portion of the lead frame. The groove extends from a portion of the fixed portion where the first binder is present toward the heat-dissipating portion.

8 Claims, 8 Drawing Sheets

(51) Int. Cl.
*H01L 23/00* (2006.01)
*H01L 23/495* (2006.01)
*H01L 23/31* (2006.01)

(52) U.S. Cl.
CPC .......... *H01L 2224/45124* (2013.01); *H01L 2224/49113* (2013.01); *H01L 2924/0133* (2013.01); *H01L 2224/32245* (2013.01); *H01L 2224/48247* (2013.01); *H01L 2924/01079* (2013.01); *H01L 2924/01014* (2013.01); *H01L 24/49* (2013.01); *H01L 2224/83385* (2013.01); *H01L 2924/01005* (2013.01); *H01L 2224/73265* (2013.01); *H01L 2924/01013* (2013.01); H01L 23/3121 (2013.01); *H01L 2924/01082* (2013.01); *H01L 2924/01006* (2013.01); *H01L 2924/00013* (2013.01); *H01L 24/45* (2013.01); H01L 24/32 (2013.01); *H01L 2224/29111* (2013.01); H01L 23/49513 (2013.01); *H01L 2224/48472* (2013.01); *H01L 2924/0105* (2013.01); *H01L 2224/32057* (2013.01); *H01L 2924/157* (2013.01); *H01L 2924/01074* (2013.01)
USPC .......... 361/767; 361/763; 361/764; 361/782

(56) References Cited

U.S. PATENT DOCUMENTS

| | | | |
|---|---|---|---|
| 5,808,873 A * | 9/1998 | Celaya et al. | 361/760 |
| 6,931,723 B1 * | 8/2005 | Powell | 29/852 |
| 2003/0127732 A1 | 7/2003 | Nakazawa et al. | |
| 2005/0006140 A1 | 1/2005 | Birgel et al. | |
| 2005/0150686 A1 * | 7/2005 | Powell | 174/262 |
| 2007/0080469 A1 | 4/2007 | Kim et al. | |
| 2009/0001535 A1 | 1/2009 | Heing et al. | |

* cited by examiner

FIG.13 - PRIOR ART
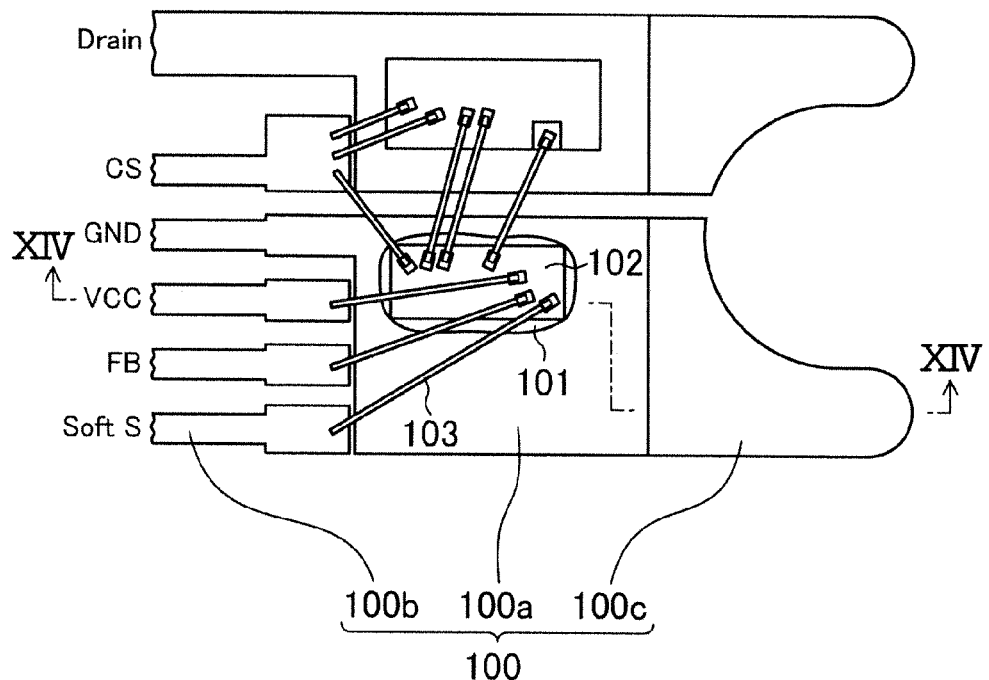
FIG.14 - PRIOR ART
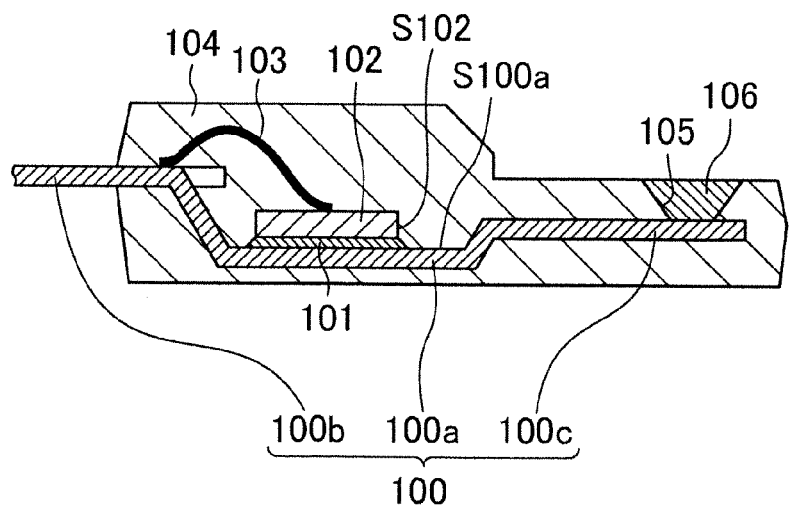

ELECTRONIC COMPONENT

CROSS-REFERENCE TO RELATED APPLICATION

This application claims priority to Japanese Patent Application No. 2010-039014 filed on Feb. 24, 2010 and Japanese Patent Application No. 2010-281320 filed on Dec. 17, 2010, the disclosure of which including the specification, the drawings, and the claims is hereby incorporated by reference in its entirety.

BACKGROUND

The present invention relates to an electronic component, and more particularly to an electronic component to be mounted on a circuit board of an electronic appliance.

In recent years, in the field of electronic appliances, a great emphasis is placed on manufacturing products with environmental considerations.

For example, there have been movements for increasing the resource recycling rate by using recyclable materials not containing harmful substances such as lead and cadmium, and such movements have been promoted through the Restriction of Hazardous Substances (RoHS) directive and the End of Life Vehicles (ELV) directive.

Lead-free solders containing no lead have been developed as substitutions for conventional lead solders, and it has been promoted to use lead-free solders instead of lead solders.

In the semiconductor field, since semiconductor components of new materials such as GaN and SiC are capable of operating with higher efficiencies or under higher temperatures as compared with conventional components, development of techniques related to semiconductor components of materials such as GaN and SiC has been expected to bring forth techniques that can lead to energy conservation.

SUMMARY

Now, a conventional electronic component will be described with reference to FIGS. 13 and 14, using a specific example where a high-power transistor of a TO220 package is used as an electronic component (see, for example, Patent Document 1: U.S. Patent Application Publication No. 2009/0001535 (US 2009/0001535 A1)). FIG. 13 is a plan view showing a configuration of the conventional electronic component. FIG. 14 is a cross-sectional view showing the configuration of the conventional electronic component. Specifically, FIG. 14 is a cross-sectional view taken along line XIV-XIV shown in FIG. 13. Note that the encapsulation resin is not shown in FIG. 13 for the sake of simplicity. In FIG. 13, "CS" stands for Common Source, "GND" Ground, "VCC" power supply, "FB" Feedback, and "Soft S" softstart.

A lead frame 100 includes a fixed portion (chip mount portion) 100a, a lead portion 100b connected to the fixed portion 100a, and a heat-dissipating portion (heatsink portion) 100c connected to the fixed portion 100a.

A semiconductor chip 102 is fixed on the fixed portion 100a of the lead frame 100 by a first binder 101 made of a lead-free solder.

The lead portion 100b and the semiconductor chip 102 are electrically connected together by a wire 103 made of a metal. The fixed portion 100a, the semiconductor chip 102, the wire 103, the base portion of the lead portion 100b, and the heat-dissipating portion 100c are encapsulated with an encapsulation resin 104.

The portion of the lead portion 100b other than the base portion is not covered with the encapsulation resin 104 but is exposed.

The heat-dissipating portion 100c dissipates, to the outside, heat of the semiconductor chip 102 which has propagated thereto via the first binder 101 during operation.

A depression 105 is what is left by a fixed pin which is used when manufacturing a conventional electronic component, and the depression 105 is filled with a filler material 106.

The tip portion of the lead portion 100b is fixed on a circuit board (not shown) by a second binder (not shown) made of a lead-free solder. Thus, the conventional electronic component is mounted on the circuit board by the second binder.

Now, a mounting method for mounting the conventional electronic component on the circuit board will be described.

Here, mounting methods for mounting components on a circuit board with solder include a point heat method, a flow method and a reflow method. The "point heat method" is a method of heating the soldered portion of a component. The "flow method" is a method of immersing the soldered portion of the component, together with the circuit board, in a bath of molten solder. The "reflow method" is a method of passing, through a reflow oven (furnace), a component placed on a circuit board with a paste of solder therebetween.

Where the point heat method or the flow method is used as the mounting method for mounting a conventional electronic component on a circuit board by the second binder, the soldered portion of the electronic component (in other words, the tip portion of the lead portion 100b) is primarily heated to a temperature greater than or equal to the melting point of the second binder. Then, since portions of the electronic component other than the soldered portion (e.g., the first binder 101) are not heated directly, it is possible to prevent the temperature of the first binder 101 from reaching a temperature greater than or equal to the melting point thereof due to heat propagation from the lead portion 100b. Therefore, it is possible to prevent the first binder 101 from melting even if the melting point of the first binder 101 is equal to or lower than the melting point of the second binder.

Specifically, first, in a case where an SnCu solder is used as the material of the first and second binders, for example, as an example where the melting point of the first binder 101 is equal to the melting point of the second binder, it is possible to prevent the temperature of the first binder from reaching a temperature greater than or equal to the melting point thereof (229° C.). Second, in a case where an SnAgCu solder is used as the material of the first binder and an SnCu solder is used as the material of the second binder, for example, as an example where the melting point of the first binder 101 is lower than the melting point of the second binder, it is possible to prevent the temperature of the first binder from reaching a temperature greater than or equal to the melting point thereof (219° C.).

On the other hand, where the reflow method is used as the mounting method for mounting a conventional electronic component on a circuit board by the second binder, since the circuit board and the electronic component are entirely heated to a temperature greater than or equal to the melting point of the second binder, the first binder 101 is heated to a temperature greater than or equal to the melting point of the second binder. Therefore, where the melting point of the first binder 101 is equal to or lower than the melting point of the second binder, the first binder 101 is heated to a temperature greater than or equal to the melting point thereof, and it is therefore not possible to prevent the first binder 101 from melting.

If the first binder 101 is heated to a temperature greater than or equal to the melting point thereof, the first binder 101 melts and expands while being sandwiched between the fixed portion 100a and the semiconductor chip 102 and hermetically sealed by the surrounding encapsulation resin 104, and therefore the first binder 101 randomly flows out into a gap S100a between the fixed portion 100a and the encapsulation resin 104 and/or a gap S102 between the semiconductor chip 102 and the encapsulation resin 104. Note that as shown in FIG. 14, the first binder 101 has its lower surface in contact with the fixed portion 100a, its upper surface in contact with the semiconductor chip 102, and its side surface in contact with the encapsulation resin 104, and the first binder 101 is hermetically sealed by the fixed portion 100a, the semiconductor chip 102 and the encapsulation resin 104.

Therefore, if a material whose melting point is equal to the melting point of the second binder or a material whose melting point is lower than the melting point of the second binder is used as the material of the first binder 101, the reflow method cannot be used.

Here, a high-power transistor of a TO220 package has the following feature. Particularly, where a heat-dissipating portion (see 60c in FIG. 8) is not encapsulated by an encapsulation resin (see 65 in FIG. 8) but is exposed as in an electronic component (see FIG. 8 to be described later) of the present invention, for example, instead of encapsulating the heat-dissipating portion 100c with the encapsulation resin 104 as in a conventional electronic component, the heat of the semiconductor chip generated during operation can be dissipated by the heat-dissipating portion by fixing the heat-dissipating portion to the circuit board. In order to make use of the feature, it is preferred to use the reflow method.

However, as described above, if a material whose melting point is equal to the melting point of the second binder or a material whose melting point is lower than the melting point of the second binder is used as the material of the first binder 101, the reflow method cannot be used. Therefore, in order to make use of the above feature, a technique for fixing the heat-dissipating portion to the circuit board by a screw, for example, can be employed.

Now, in response to such a problem, if a material whose melting point is higher than the melting point of the second binder is used as the material of the first binder 101, the reflow method can be used. Such materials include a gold tin (AuSn)-type solder and a zinc aluminum (ZnAl)-type solder. However, a drawback of the AuSn-type solder is that it is more expensive than the SnCu-type solder. A drawback of the ZnAl-type solder is that an existing reflow oven (a reflow oven set to a temperature less than or equal to 300° C.) cannot be used because the melting point thereof exceeds 300° C.

Thus, a practical lead-free solder having a melting point of 240-300° C. has not yet been discovered, and lead-free solders other than those having a melting point of 210-240° C., e.g., SnAgCu and SnCu, have hardly been used.

Note that while the above description has been made using a specific example where a high-power transistor is used as an electronic component, there are drawbacks similar to those of a high-power transistor also when a high-frequency amplifier, for example, is used instead of a high-power transistor. That is, during the mounting process of mounting an electronic component (i.e., a high-frequency amplifier) on a circuit board by the second binder, if the first binder fixing the semiconductor chip on the substrate melts and expands, the first binder randomly flows out into the gap between the substrate and the encapsulation resin and/or the gap between the semiconductor chip and the encapsulation resin.

In view of the above, an object of the present invention is to prevent the first binder from randomly flowing out during the mounting process of mounting an electronic component on a circuit board by the second binder using the reflow method.

In order to achieve the object above, a first electronic component of the present invention is an electronic component mounted on a circuit board including: a substrate; a semiconductor chip fixed on the substrate by a first binder; and an encapsulation resin for encapsulating the substrate and the semiconductor chip, wherein the substrate includes a through hole running through the substrate from a portion of a principal surface of the substrate where the first binder is present toward a side surface of the substrate, and a portion of the through hole closer to the principal surface of the substrate is filled with a portion of the first binder.

With the first electronic component of the present invention, the substrate includes the through hole running through the substrate from a portion of the principal surface of the substrate where the first binder is present toward the side surface of the substrate. Thus, even if the first binder melts and expands during the mounting process of mounting the electronic component on the circuit board by the second binder, the first binder expands within the through hole, and the first binder does not expand under an airtight condition as with conventional techniques. Thus, it is possible to prevent the first binder from randomly flowing out.

Therefore, even if a material whose melting point is equal to the melting point of the second binder or a material whose melting point is lower than the melting point of the second binder is used as the material of the first binder, it is possible to prevent the first binder from randomly flowing out, and thus the reflow method can be used.

In order to achieve the object above, a second electronic component of the present invention is an electronic component mounted on a circuit board including: a substrate; a semiconductor chip fixed on the substrate by a first binder; and an encapsulation resin for encapsulating the substrate and the semiconductor chip, wherein the substrate includes a through hole running through the substrate from a portion of a principal surface of the substrate where the first binder is present toward a side surface of the substrate, the substrate includes a lower substrate, at least one middle substrate formed on the lower substrate, and an upper substrate formed on an uppermost one of the at least one middle substrate, the through hole includes a first hole portion, and a second hole portion one end of which is connected to the first hole portion, the first hole portion runs through the upper substrate, and the second hole portion is provided in one of the at least one middle substrate, and an other open end thereof is at a side surface of the one of the at least one middle substrate.

With the second electronic component of the present invention, the substrate includes the through hole running through the substrate from a portion of the principal surface of the substrate where the first binder is present toward the side surface of the substrate. Thus, even if the first binder melts and expands during the mounting process of mounting the electronic component on the circuit board by the second binder, the first binder expands within the through hole, and the first binder does not expand under an airtight condition as with conventional techniques. Thus, it is possible to prevent the first binder from randomly flowing out.

Therefore, even if a material whose melting point is equal to the melting point of the second binder or a material whose melting point is lower than the melting point of the second binder is used as the material of the first binder, it is possible to prevent the first binder from randomly flowing out, and thus the reflow method can be used.

In the second electronic component of the present invention, it is preferred that the electronic component further includes an electrode pad provided on the substrate and electrically connected to the semiconductor chip by a thin metal wire, wherein the second hole portion is provided in a portion of the substrate other than portions thereof under the electrode pad.

In the second electronic component of the present invention, it is preferred that the first hole portion, or the first hole portion and a portion of the second hole portion, is filled with a portion of the first binder.

In order to achieve the object above, a third electronic component of the present invention is an electronic component mounted on a circuit board including: a lead frame including a fixed portion, a lead portion connected to the fixed portion, and a heat-dissipating portion connected to the fixed portion; a semiconductor chip fixed on the fixed portion by a first binder; and an encapsulation resin for encapsulating the fixed portion, the semiconductor chip, and a base portion of the lead portion, wherein a groove is provided in the fixed portion and the heat-dissipating portion of the lead frame, and the groove extends from a portion of the fixed portion where the first binder is present toward the heat-dissipating portion.

With the third electronic component of the present invention, the groove is provided in the fixed portion and the heat-dissipating portion of the lead frame, and the groove extends from a portion of the fixed portion where the first binder is present toward the heat-dissipating portion. Thus, even if the first binder melts and expands during the mounting process of mounting the electronic component on the circuit board by the second binder, the first binder expands within the groove, and the first binder does not expand under an airtight condition as with conventional techniques. Thus, it is possible to prevent the first binder from randomly flowing out.

Therefore, even if a material whose melting point is equal to the melting point of the second binder or a material whose melting point is lower than the melting point of the second binder is used as the material of the first binder, it is possible to prevent the first binder from randomly flowing out, and thus the reflow method can be used.

In the third electronic component of the present invention, it is preferred that a portion of the first binder is buried in the groove.

In the third electronic component of the present invention, it is preferred that a dent connected to the groove is provided in the heat-dissipating portion of the lead frame.

Thus, even if the first binder melts and expands during the mounting process, the first binder expands within the groove and the dent, and it is possible to prevent the first binder from randomly flowing out. Particularly, even if the expansion of the first binder is not confined within the groove, the first binder does not flow out of the groove but the expansion of the first binder can be accommodated in the dent.

In the third electronic component of the present invention, it is preferred that a depth of the dent is greater than a depth of the groove.

In the third electronic component of the present invention, a width of the dent is greater than a width of the groove.

In the first, second or third electronic component of the present invention, it is preferred that a material of the first binder is a lead-free solder.

In the first, second or third electronic component of the present invention, it is preferred that the electronic component is mounted on the circuit board by a second binder, and a melting point of the first binder is equal to or lower than a melting point of the second binder.

In the first, second or third electronic component of the present invention, it is preferred that a material of the second binder is a lead-free solder.

As described above, with the electronic component of the present invention, even if the first binder melts and expands during the mounting process of mounting the electronic component on the circuit board by the second binder, the first binder expands within the through hole (the first embodiment) or the groove (the second embodiment), and the first binder does not expand under an airtight condition as with conventional techniques. Therefore, it is possible to prevent the first binder from randomly flowing out.

Thus, even if a material whose melting point is equal to the melting point of the second binder or a material whose melting point is lower than the melting point of the second binder is used as the material of the first binder, it is possible to prevent the first binder from randomly flowing out, and thus the reflow method can be used.

BRIEF DESCRIPTION OF THE DRAWINGS

FIG. 13 is a plan view showing a configuration of a conventional electronic component.

FIG. 14 is a cross-sectional view showing the configuration of the conventional electronic component taken along line XIV-XIV shown in FIG. 13.

DETAILED DESCRIPTION (First Embodiment)

Figure 1:
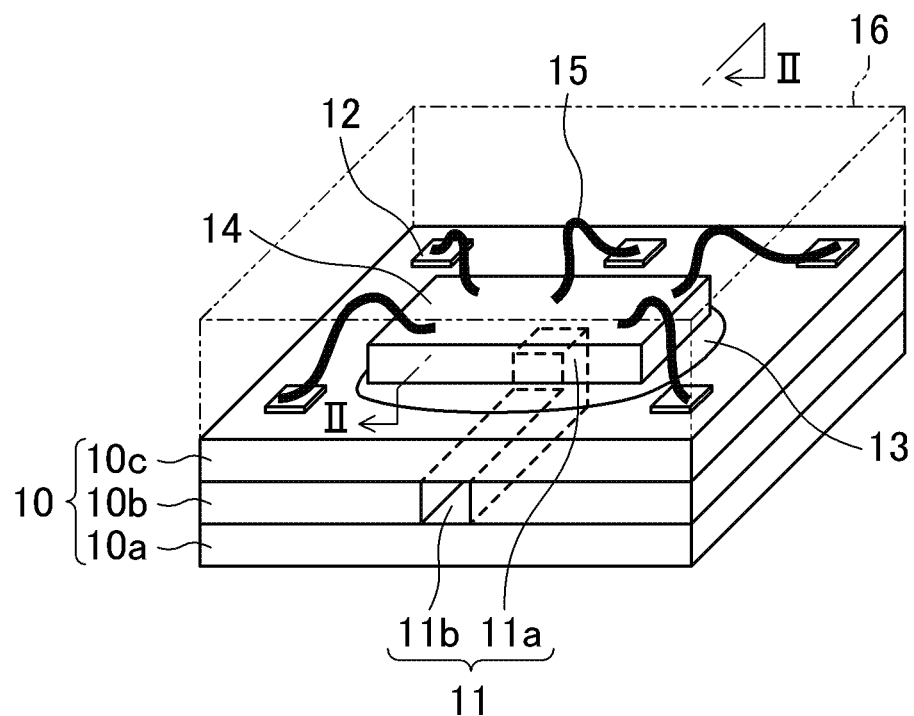
FIG. 1 is a perspective view showing a configuration of an electronic component according to a first embodiment of the present invention.
Figure 2:
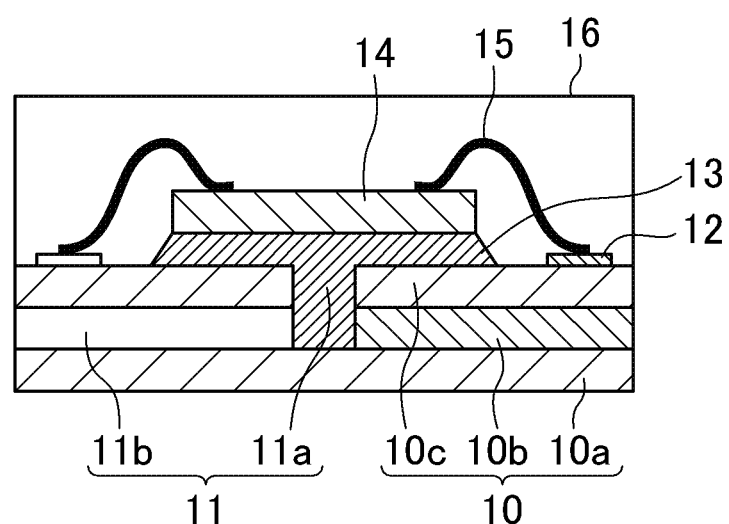
FIG. 2 is a cross-sectional view showing the configuration of the electronic component according to the first embodiment of the present invention taken along line II-II shown in FIG. 1.

Now, an electronic component according to a first embodiment of the present invention will be described with reference to FIGS. 1 and 2 using a specific example where a high-frequency amplifier is used as the electronic component. FIG. 1 is a perspective view showing a configuration of the electronic component according to the first embodiment of the present invention. FIG. 2 is a cross-sectional view showing the configuration of the electronic component according to the first embodiment of the present invention. Specifically, FIG. 2 is a cross-sectional view taken along line II-II shown in FIG. 1.

As shown in FIGS. 1 and 2, a GaN-type semiconductor chip 14, for example, is fixed on a substrate 10 made of ceramics, for example, by a first binder 13. The substrate 10 is, for example, a layered substrate including a first substrate (lower substrate) 10a, a second substrate (middle substrate) 10b, and a third substrate (upper substrate) 10c layered in this order. The material of the first binder 13 is preferably a lead-free solder such as an SnCu solder or an SnAgCu solder, for example.

As shown in FIGS. 1 and 2, electrode pads 12 made of a metal, for example, formed on the substrate 10 are electrically connected to the semiconductor chip 14 by wires (thin metal wires) 15 made of aluminum (Al), for example. The substrate 10, the semiconductor chip 14 and the wires 15 are encapsulated by an encapsulation resin 16 made of a resin, for example.

As shown in FIGS. 1 and 2, the substrate 10 includes a through hole 11 running through the substrate 10 from the portion of the principal surface of the substrate 10 where the first binder 13 is present toward the side surface of the substrate 10. The open end of the through hole 11 is provided at the side surface of the substrate 10. The through hole 11 is connected to the outside of the electronic component.

As shown in FIG. 2, a portion of the through hole 11 toward the principal surface of the substrate 10 is filled with a portion of the first binder 13. Since the through hole 11 is connected to the outside of the electronic component, as described above, the first binder 13 is exposed to the ambient air through the through hole 11. On the other hand, a portion of the through hole 11 toward the side surface of the substrate 10 is not filled with the first binder 13.

As shown in FIG. 2, the cross-sectional shape of the through hole 11 is an L-letter shape, for example.

The through hole 11 includes a first hole portion 11a and a second hole portion 11b.

The first hole portion 11a extends in a direction perpendicular to the principal surface of the substrate 10 running through the third substrate 10c and the second substrate 10b.

The second hole portion 11b one end of which is connected to the first hole portion 11a is provided in the second substrate 10b, and extends in a direction parallel to the principal surface of the substrate 10. The other open end of the second hole portion 11b is provided at the side surface of the substrate 10, specifically, the side surface of the second substrate 10b.

As shown in FIG. 1, the second hole portion 11b is provided in a portion of the substrate 10 other than portions under the electrode pads 12.

As shown in FIG. 2, the first hole portion 11a is filled with a portion of the first binder 13. On the other hand, the second hole portion 11b is not filled with the first binder 13.

The electronic component of the present embodiment is mounted on a circuit board (not shown) by a second binder (not shown). The material of the second binder is preferably a lead-free solder such as an SnCu solder or an SnAgCu solder, for example. The circuit board may be a printed circuit board of cellular phone base station equipment, for example.

A method for mounting an electronic component of the present embodiment on a circuit board will now be described.

The electronic component of the present embodiment is mounted on the circuit board by the second binder using the reflow method.

Specifically, the electronic component of the present embodiment is placed on a paste solder applied on the circuit board, and heated with a peak temperature of 265° C., for example, and with a peak temperature duration of 5 sec, for example. Then, the electronic component is cooled.

Even if the first binder 13 melts and expands when heated, the first binder expands within the through hole 11. Then, when cooled, the first binder solidifies and shrinks.

According to the present embodiment, the substrate 10 includes the through hole 11 running through the substrate 10 from the portion of the principal surface of the substrate 10 where the first binder 13 is present toward the side surface of the substrate 10. Therefore, even if the first binder 13 melts and expands during the mounting process, the first binder expands within the through hole 11, and the first binder does not expand under an airtight condition as with conventional techniques. Thus, it is possible to prevent the first binder from randomly flowing out into the gap between the substrate 10 and the encapsulation resin 16 and/or the gap between the semiconductor chip 14 and the encapsulation resin 16.

Therefore, even if a material whose melting point is equal to the melting point of the second binder or a material whose melting point is lower than the melting point of the second binder is used as the material of the first binder 13, it is possible to prevent the first binder from randomly flowing out, and thus the reflow method can be used.

Note that while the present embodiment has been described above using a specific example where the first hole portion 11a is filled with a portion of the first binder 13 and the second hole portion 11b is not filled, the present invention is not limited to this.

Figure 3A:
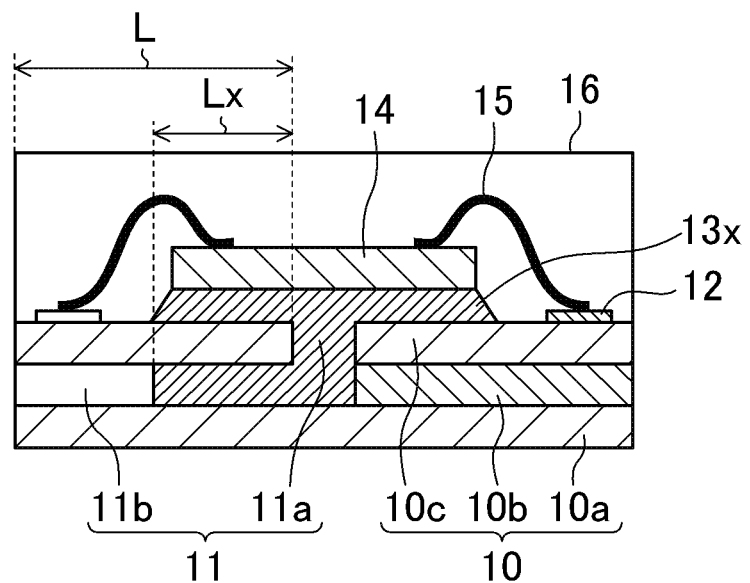
FIGS. 3A and 3B are cross-sectional views showing a configuration of an electronic component according to another example of the first embodiment of the present invention.
Figure 3B:
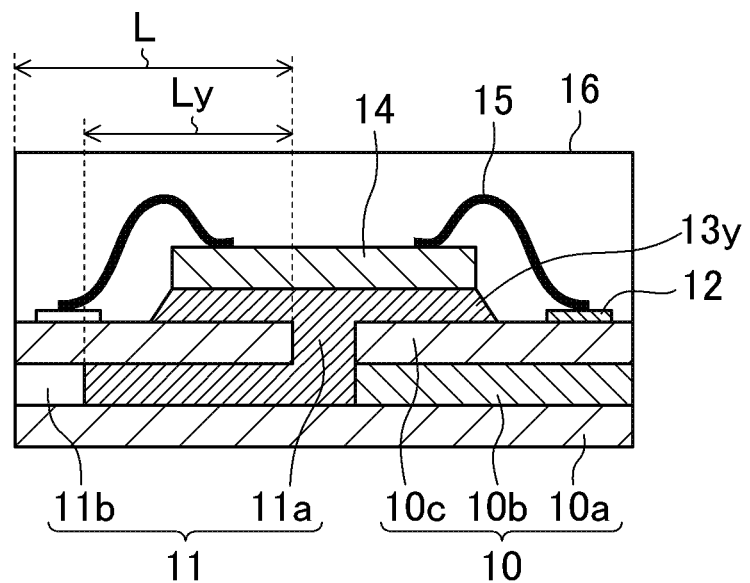

For example, as shown in FIGS. 3A and 3B, not only the first hole portion 11a, but also a portion of the second hole portion 11b may be filled with a portion of a first binder 13x, 13y. First, in the case of FIG. 3A, for example, the filling length Lx is ½ the length L of the second hole portion 11b (Lx=L×½). Second, in the case of FIG. 3B, for example, the filling length Ly is ¾ the length L of the second hole portion 11b (Ly=L×¾). The "filling length Lx, Ly" refers to the length of the portion of the second hole portion 11b that is filled with the first binder 13x, 13y. Note that the filling length is not limited to the filling length Lx shown in FIG. 3A or the filling length Ly shown in FIG. 3B.

Note that while the present embodiment has been described above using a specific example where the substrate 10 is a layered substrate, the present invention is not limited to this. For example, the substrate may be a single-layer substrate.

<Variation 1 of First Embodiment>

Figure 4A:
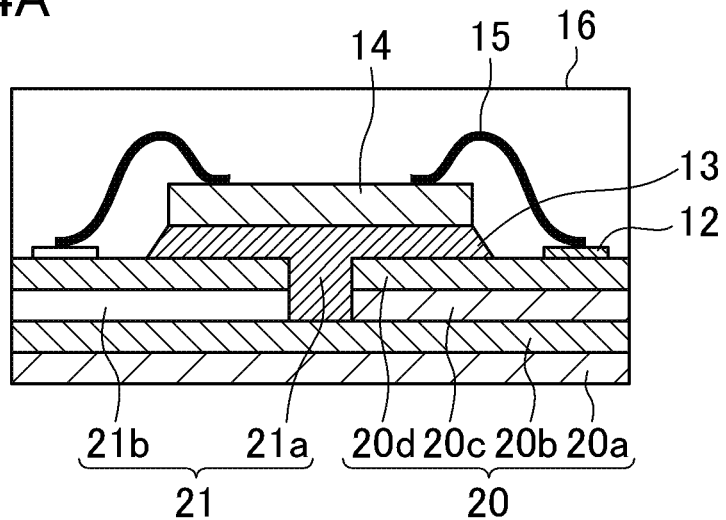
FIGS. 4A and 4B are cross-sectional views showing a configuration of an electronic component according to Variation 1 of the first embodiment of the present invention.
Figure 4B:
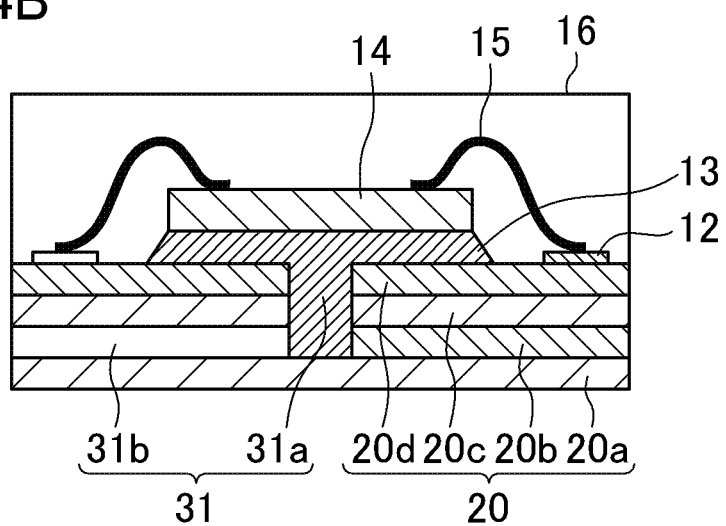

An electronic component according to Variation 1 of the first embodiment of the present invention will now be described with reference to FIGS. 4A and 4B using a specific example where a high-frequency amplifier is used as the electronic component. FIGS. 4A and 4B are cross-sectional views showing a configuration of the electronic component according to Variation 1 of the first embodiment of the present invention. In FIGS. 4A and 4B, like elements to those of the first embodiment will be denoted by like reference numerals to those used in FIGS. 1 and 2. Accordingly, in Variation 1, similar descriptions to those made in the first embodiment will be omitted.

As shown in FIGS. 4A and 4B, a substrate 20 is a layered substrate including, for example, a first substrate (lower substrate) 20a, a second substrate (middle substrate) 20b, a third substrate (middle substrate) 20c and a fourth substrate (upper substrate) 20d layered in this order. In other words, the substrate 20 is a layered substrate in which two layers of middle substrates 20b and 20c, for example, are interposed between the lower substrate 20a and the upper substrate 20d.

First, in the case of FIG. 4A, for example, a through hole 21 includes a first hole portion 21a and a second hole portion 21b. The first hole portion 21a runs through the fourth substrate 20d and the third substrate 20c. The second hole portion 21b one end of which is connected to the first hole portion 21a is provided in the third substrate 20c. The other open end of the second hole portion 21b is provided at the side surface of the third substrate 20c.

Second, in the case of FIG. 4B, for example, a through hole 31 includes a first hole portion 31a and a second hole portion 31b. The first hole portion 31a runs through the fourth substrate 20d, the third substrate 20c and the second substrate 20b. The second hole portion 31b one end of which is connected to the first hole portion 31a is provided in the second substrate 20b. The other open end of the second hole portion 31b is provided at the side surface of the second substrate 20b.

As can be seen from FIGS. 4A and 4B, the first hole portion runs at least through the upper substrate and does not run through the lower substrate.

The second hole portion one end of which is connected to the first hole portion is provided in one of a plurality of middle substrates, and the other open end of the second hole portion is provided at the side surface of the one of the middle substrates.

Variation 1 provides effects similar to those of the first embodiment.

<Variation 2 of First Embodiment>

Figure 5:
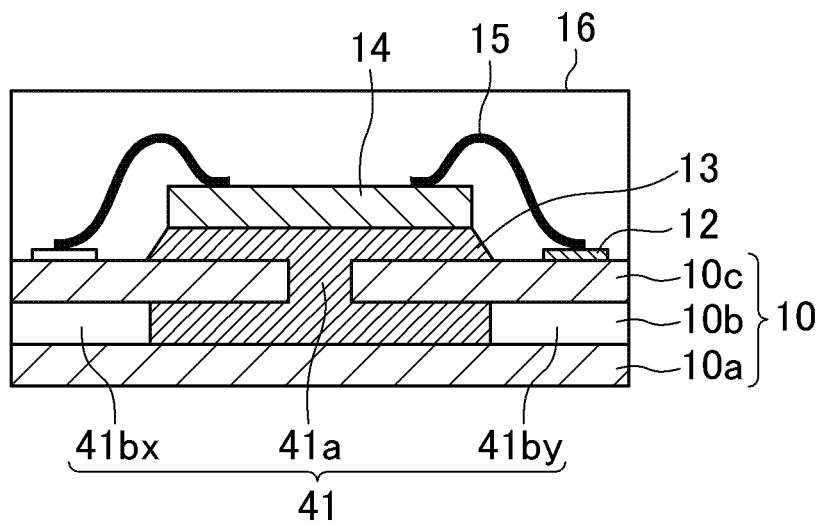
FIG. 5 is a cross-sectional view showing a configuration of an electronic component according to Variation 2 of the first embodiment of the present invention.

An electronic component according to Variation 2 of the first embodiment of the present invention will now be described with reference to FIG. 5 using a specific example where a high-frequency amplifier is used as the electronic component. FIG. 5 is a cross-sectional view showing a configuration of the electronic component according to Variation 2 of the first embodiment of the present invention. In FIG. 5, like elements to those of the first embodiment will be denoted by like reference numerals to those used in FIGS. 1 and 2. Accordingly, in Variation 2, similar descriptions to those made in the first embodiment will be omitted.

As shown in FIG. 5, the cross-sectional shape of a through hole 41 is an inverted T-letter shape, for example. Thus, while the first embodiment has been described above using a specific example where the cross-sectional shape of the through hole 11 is an L-letter shape, the present invention is not limited to this, and it may be an inverted T-letter shape.

The through hole 41 includes a first hole portion 41a, a second hole portion 41bx and a second hole portion 41by. The first hole portion 41a runs through the third substrate 10c and the second substrate 10b. The second hole portion 41bx one end of which is connected to the first hole portion 41a is provided in the second substrate 10b. The other open end of the second hole portion 41bx is provided at the side surface of the second substrate 10b. Similarly, the second hole portion 41by one end of which is connected to the first hole portion 41a is provided in the second substrate 10b. The other open end of the second hole portion 41by is provided at the side surface of the second substrate 10b.

Thus, while the first embodiment has been described above using a specific example where the number of second hole portion 11b is one as shown in FIG. 1, the present invention is not limited to this. For example, the number of second hole portions 41bx, 41by may be two as shown in FIG. 5. That is, the number of second hole portions one end of which is connected to the first hole portion and the other open end of which is provided at the side surface of the substrate may be at least one or more.

Variation 2 provides effects similar to those of the first embodiment.

<Variation 3 of First Embodiment>

Figure 6:
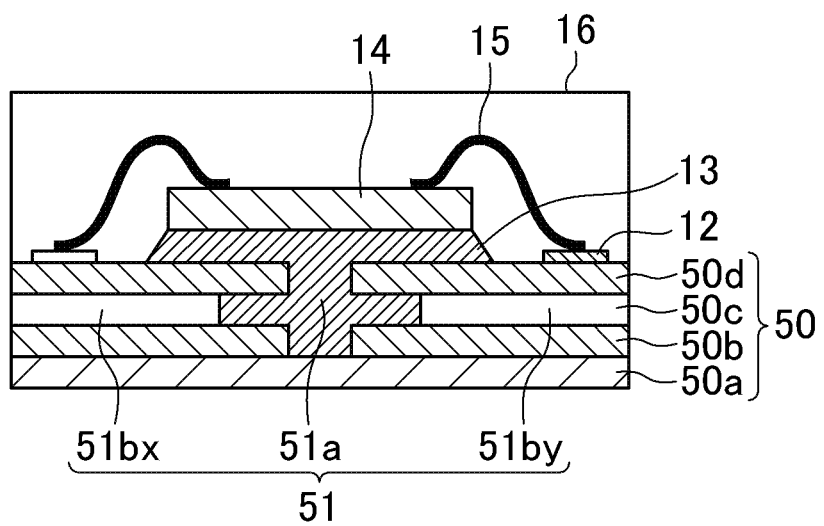
FIG. 6 is a cross-sectional view showing a configuration of an electronic component according to Variation 3 of the first embodiment of the present invention.

An electronic component according to Variation 3 of the first embodiment of the present invention will now be described with reference to FIG. 6 using a specific example where a high-frequency amplifier is used as the electronic component. FIG. 6 is a cross-sectional view showing a configuration of the electronic component according to Variation 3 of the first embodiment of the present invention. In FIG. 6, like elements to those of the first embodiment will be denoted by like reference numerals to those used in FIGS. 1 and 2. Accordingly, in Variation 3, similar descriptions to those made in the first embodiment will be omitted.

As shown in FIG. 6, a substrate 50 is a layered substrate including, for example, a first substrate (lower substrate) 50a, a second substrate (middle substrate) 50b, a third substrate (middle substrate) 50c and a fourth substrate (upper substrate) 50d layered in this order.

As shown in FIG. 6, the cross-sectional shape of a through hole 51 is a cross shape, for example. Thus, while the first embodiment has been described above using a specific example where the cross-sectional shape of the through hole 11 is an L-letter shape, the present invention is not limited to this, and it may be a cross shape.

The through hole 51 includes a first hole portion 51a, a second hole portion 51bx and a second hole portion 51by. The first hole portion 51a runs through the fourth substrate 50d, the third substrate 50c and the second substrate 50b. The second hole portion 51bx one end of which is connected to the first hole portion 51a is provided in the third substrate 50c. The other open end of the second hole portion 51bx is provided at the side surface of the third substrate 50c. Similarly, the second hole portion 51by one end of which is connected to the first hole portion 51a is provided in the third substrate 50c. The other open end of the second hole portion 51by is provided at the side surface of the third substrate 50c.

Thus, while the first embodiment has been described above using a specific example where one end of the second hole portion 11b is connected to a lower end portion of the first hole portion 11a, the present invention is not limited to this. For example, as shown in FIG. 6, one end of the second hole portion 51bx, 51by may be connected to a central portion of the first hole portion 51a.

Variation 3 provides effects similar to those of the first embodiment.

Note that while Variation 3 has been described above using a specific example where the second hole portion 51bx and the second hole portion 51by are provided in the same middle substrate (i.e., the third substrate 50c), the present invention is not limited to this. For example, the second hole portion 51bx may be provided in the third substrate (middle substrate) 50c while the second hole portion 51by may be provided in the second substrate (middle substrate) 50b. That is, the second hole portion 51bx and the second hole portion 51by may be provided in different middle substrates.

(Second Embodiment)

Figure 7:
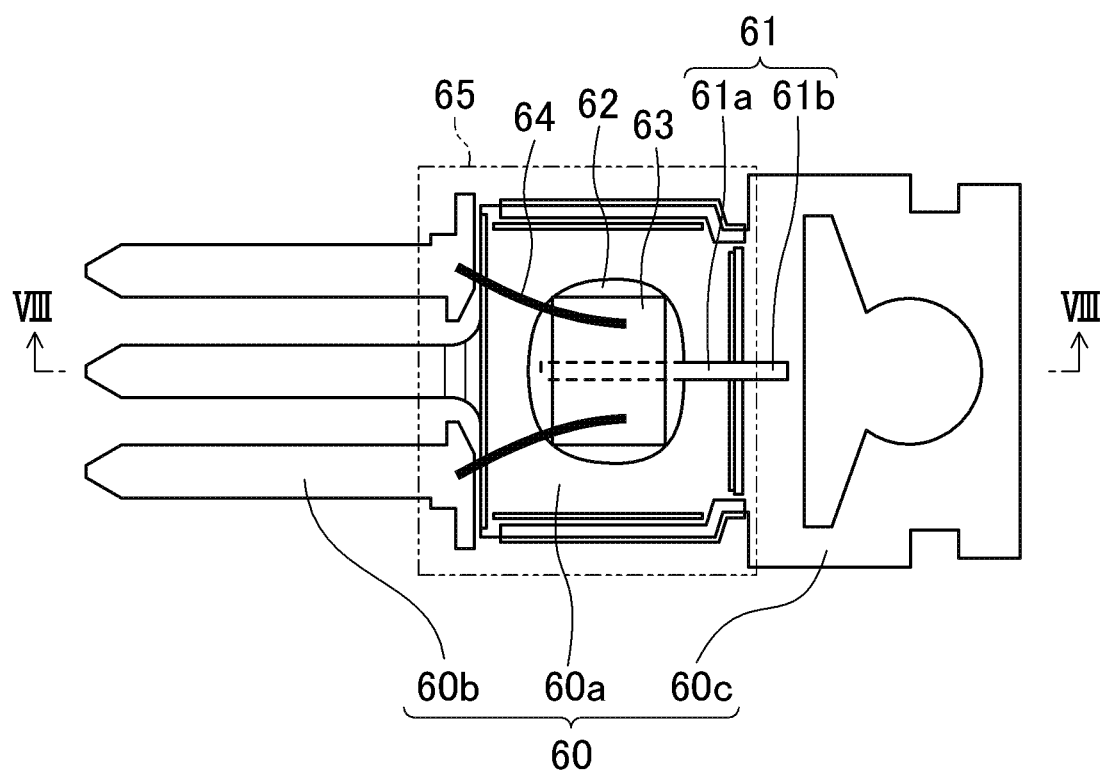
FIG. 7 is a plan view showing a configuration of an electronic component according to a second embodiment of the present invention.
Figure 8:
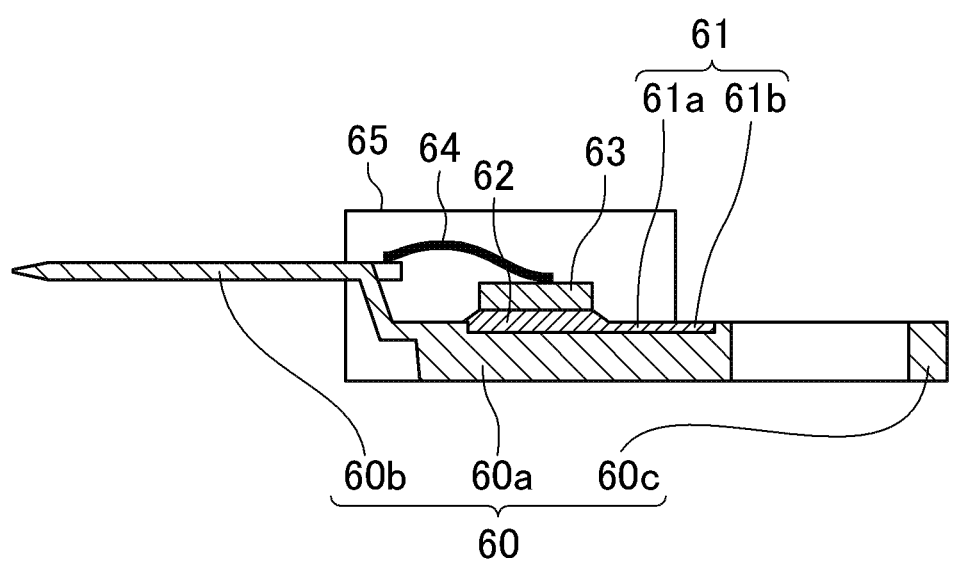
FIG. 8 is a cross-sectional view showing the configuration of the electronic component according to the second embodiment of the present invention taken along line VIII-VIII shown in FIG. 7.

An electronic component according to a second embodiment of the present invention will now be described with reference to FIGS. 7 and 8 using a specific example where a high-power transistor of a TO220 package, for example, is used as the electronic component. FIG. 7 is a plan view showing a configuration of the electronic component according to the second embodiment of the present invention. FIG. 8 is a cross-sectional view showing a configuration of the electronic component according to the second embodiment of the present invention. Specifically, FIG. 8 is a cross-sectional view taken along line VIII-VIII shown in FIG. 7.

As shown in FIGS. 7 and 8, a lead frame 60 made of a metal, for example, includes a fixed portion 60a, a lead portion 60b connected to the fixed portion 60a, and a heat-dissipating portion 60c connected to the fixed portion 60a.

As shown in FIGS. 7 and 8, a semiconductor chip 63 including a metal film (not shown) formed on the reverse surface thereof is fixed on the fixed portion 60a of the lead frame 60 by a first binder 62. The material of the first binder 62 is preferably a lead-free solder such as an SnCu solder or an SnAgCu solder, for example.

As shown in FIGS. 7 and 8, the lead portion 60b and the semiconductor chip 63 are electrically connected together by a wire 64 made of a metal, for example. The fixed portion 60a, the semiconductor chip 63, the wire 64 and the base portion of the lead portion 60b are encapsulated by an encapsulation resin 65 made of a resin, for example. Here, "the base portion of the lead portion 60b" refers to a portion of the lead portion 60b where the wire 64 is present.

As shown in FIGS. 7 and 8, a groove 61 is provided in the fixed portion 60a and the heat-dissipating portion 60c of the lead frame 60. The groove 61 extends from a portion of the fixed portion 60a where the first binder 62 is present toward the heat-dissipating portion 60c. The groove 61 includes a first groove portion 61a provided in the fixed portion 60a, and a second groove portion 61b provided in the heat-dissipating portion 60c and connected to the first groove portion 61a.

A portion of the first binder 62 is buried in the groove 61 as shown in FIG. 8. A portion of the first binder 62 buried in the second groove portion 61b is not covered with the encapsulation resin 65 but is exposed.

A portion of the lead portion 60b other than the base portion is not covered with the encapsulation resin 65 but is exposed. The heat-dissipating portion 60c is not covered with the encapsulation resin 65 but is exposed.

The heat-dissipating portion 60c dissipates, to the outside, heat of the semiconductor chip 63 which has propagated thereto via the first binder 62 during operation.

The tip portion of the lead portion 60b and the heat-dissipating portion 60c are fixed on a circuit board (not shown) by a second binder (not shown). Thus, the electronic component of the present embodiment is mounted on the circuit board by the second binder. The material of the second binder is preferably a lead-free solder such as an SnCu solder or an SnAgCu solder, for example.

Now, a method for mounting the electronic component of the present embodiment on the circuit board will be described.

The electronic component of the present embodiment is mounted on the circuit board by the second binder using the reflow method.

Specifically, the electronic component of the present embodiment is placed on a solder paste applied on the circuit board and heated. Then, the electronic component is cooled.

Even if the first binder 62 melts and expands when heated, the first binder expands primarily within the groove 61 (particularly, within the second groove portion 61b). Then, when cooled, the first binder solidifies and shrinks.

According to the present embodiment, the groove 61 is provided in the fixed portion 60a and the heat-dissipating portion 60c of the lead frame 60, and the groove 61 extends from a portion of the fixed portion 60a where the first binder 62 is present toward the heat-dissipating portion 60c. Thus, even if the first binder 62 melts and expands during the mounting process, the first binder expands within the groove 61 (particularly, the second groove portion 61b), and the first binder does not expand under an airtight condition as with conventional techniques. Therefore, it is possible to prevent the first binder from randomly flowing out into the gap between the fixed portion 60a and the encapsulation resin 65 and/or the gap between the semiconductor chip 63 and the encapsulation resin 65.

Therefore, even if a material whose melting point is equal to the melting point of the second binder or a material whose melting point is lower than the melting point of the second binder is used as the material of the first binder 62, it is possible to prevent the first binder from randomly flowing out, and thus the reflow method can be used.

<Variation of Second Embodiment>

Figure 9:
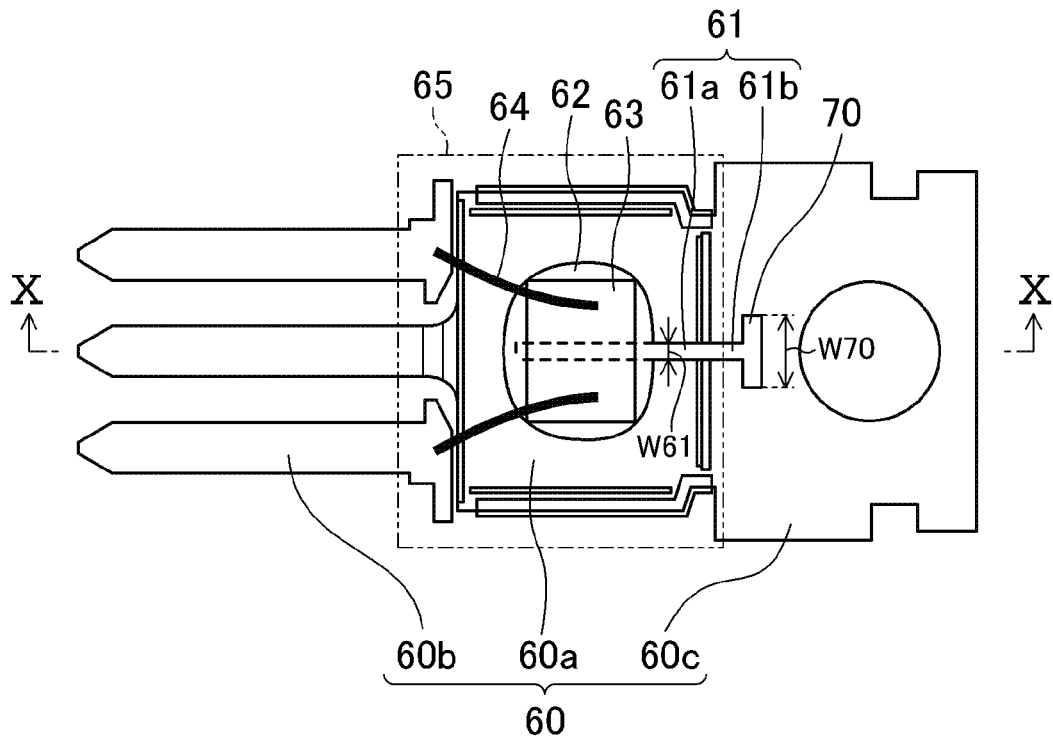
FIG. 9 is a plan view showing a configuration of an electronic component according to a variation of the second embodiment of the present invention.
Figure 10:
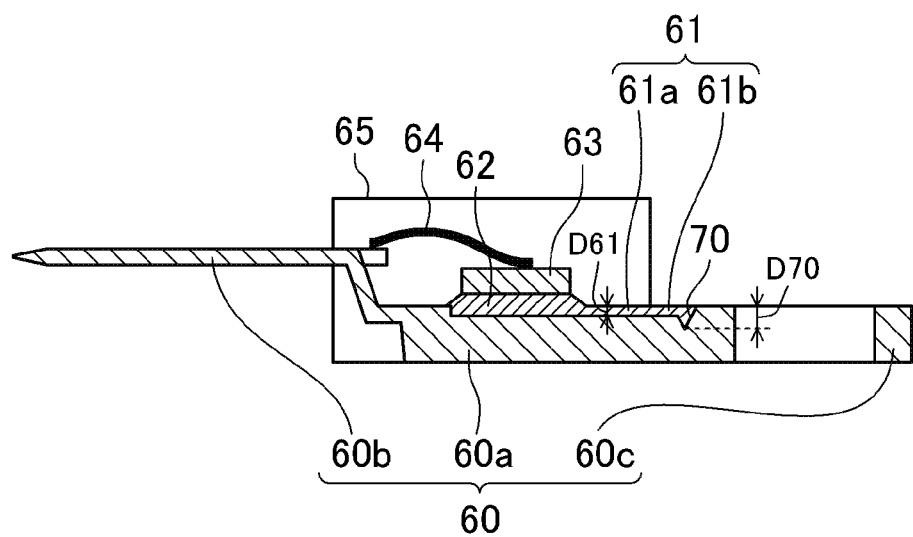
FIG. 10 is a cross-sectional view showing the configuration of the electronic component according to the variation of the second embodiment of the present invention taken along line X-X shown in FIG. 9.

An electronic component according to a variation of the second embodiment of the present invention will now be described with reference to FIGS. 9 and 10 using a specific example where a high-power transistor of a TO220 package, for example, is used as the electronic component. FIG. 9 is a plan view showing a configuration of the electronic component according to the variation of the second embodiment of the present invention. FIG. 10 is a cross-sectional view showing a configuration of the electronic component according to the variation of the second embodiment of the present invention. Specifically, FIG. 10 is a cross-sectional view taken along line X-X shown in FIG. 9. In FIGS. 9-10, like elements to those of the second embodiment will be denoted by like reference numerals to those used in FIGS. 7-8. Accordingly, in this variation, similar descriptions to those made in the second embodiment will be omitted.

A structural difference between this variation and the second embodiment is as follows.

In the second embodiment, the groove 61 is provided in the fixed portion 60a and the heat-dissipating portion 60c of the lead frame 60 as shown in FIG. 8.

On the other hand, in this variation, a dent 70 is provided in addition to the groove 61 as shown in FIG. 10. The dent 70 is provided in the heat-dissipating portion 60c of the lead frame 60 and is connected to the groove 61.

The depth D70 of the dent 70 is greater than the depth D61 of the groove 61. The width W70 of the dent 70 is greater than the width W61 of the groove 61. The "depth D70 of the dent 70" refers to the dimension from the surface of the heat-dissipating portion 60c to the lowest point (i.e., the apex) of the dent 70 whose cross-sectional shape is a triangular shape. The "width W70 of the dent 70" refers to the dimension of one side of the dent 70 whose plane shape is a rectangular shape that is in contact with the groove 61 (i.e., the left side).

A method for mounting the electronic component of this variation on a circuit board will now be described.

The electronic component of this variation is mounted on the circuit board by the second binder using the reflow method.

Specifically, the electronic component of this variation is placed on a solder paste applied on the circuit board and heated. Then, the electronic component is cooled.

Even if the first binder 62 melts and expands when heated, the first binder expands within the groove 61 (particularly the second groove portion 61b) and within the dent 70. Then, when cooled, the first binder solidifies and shrinks.

According to this variation, even if the first binder 62 melts and expands during the mounting process, the first binder expands within the groove 61 (particularly the second groove portion 61b) and within the dent 70, and it is therefore possible to prevent the first binder from randomly flowing out.

Particularly, in the second embodiment, when the amount of the first binder 62 is large for reasons such as the size of the semiconductor chip 63 being large, the expansion of the first binder may not be confined within the groove 61, and the first binder may flow out of the groove 61. However, in this variation, even if the expansion of the first binder is not confined within the groove 61, the first binder does not flow out of the groove 61 but the expansion of the first binder can be accommodated in the dent 70.

Note that while this variation has been described above using a specific example where the plane shape of the dent 70 is a rectangular shape as shown in FIG. 9 and the cross-sectional shape of the dent 70 is a triangular shape as shown in FIG. 10, the present invention is not limited to this.

Figure 11:
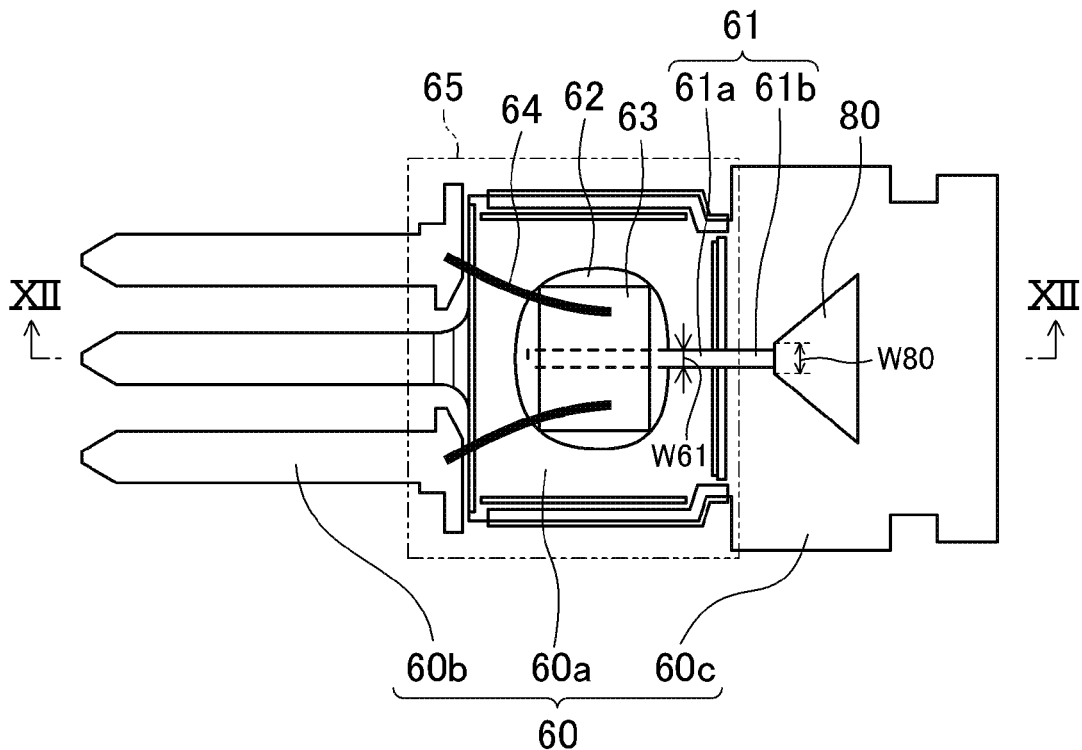
FIG. 11 is a plan view showing a configuration of an electronic component according to another example of the second embodiment of the present invention.
Figure 12:
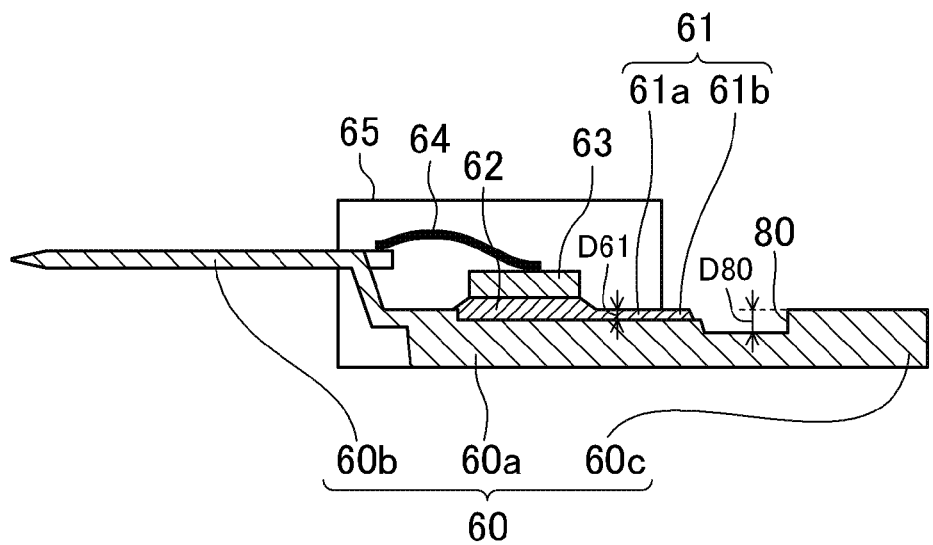
FIG. 12 is a cross-sectional view showing the configuration of the electronic component according to another example of the second embodiment of the present invention taken along line XII-XII shown in FIG. 11.

For example, the plane shape of a dent 80 may be a trapezoidal shape as shown in FIG. 11, and the cross-sectional shape of the dent 80 may be a rectangular shape as shown in FIG. 12. The depth D80 of the dent 80 is greater than the depth D61 of the groove 61. The width W80 of the dent 80 is greater than the width W61 of the groove 61. The "depth D80 of the dent 80" refers to the dimension from the surface of the heat-dissipating portion 60c to the lower surface of the dent 80 whose cross-sectional shape is a rectangular shape. The "width W80 of the dent 80" refers to the dimension of one side of the dent 80 whose plane shape is a trapezoidal shape that is in contact with the groove 61 (i.e., the smaller base). Note that the cross-sectional shape of the dent is not limited to the triangular shape shown in FIG. 10 or the rectangular shape shown in FIG. 12, and it may be a semi-circular shape, a semi-elliptical shape, or the like, for example. Note that the plane shape of the dent is not limited to the rectangular shape shown in FIG. 9 or the trapezoidal shape shown in FIG. 11, and it may be a circular shape, an elliptical shape, or the like, for example.

Note that the first embodiment and Variations 1, 2 and 3 thereof have been described above using a specific example where a high-frequency amplifier is used as the electronic component, while the second embodiment and the variation thereof have been described above using a specific example where a high-power transistor is used as the electronic component, but the present invention is not limited to this. For example, the electronic component may be a diode, an integrated circuit, a light emitting device, a filter, an inductor, or the like.

That is, the present invention can be applied to thereby solve the problems of the conventional techniques (in other words, to achieve the object of the present invention) as long as the melting point of a second binder for fixing an electronic component on a circuit board is equal to or higher than the melting point of a first binder of the electronic component so that the first binder once melts during the mounting process.

While the first embodiment and Variations 1, 2 and 3 thereof have been described above using a specific example where the material of the portion of the first binder 13 inside the through holes 11, 21, 31, 41 and 51 is the same as the material of the portion of the first binder 13 on the surface (principal surface) of the substrate 10, the present invention is not limited to this, and the materials may be different from each other. Similarly, while the second embodiment and the variation thereof have been described above using a specific example where the material of the portion of the first binder 62 buried in the groove 61 is the same as the material of the portion of the first binder 62 on the surface of the fixed portion 60a, the present invention is not limited to this, and the materials may be different from each other.

Electronic components of new materials such as GaN and SiC have been highly expected to be environmentally-friendly electronic components. These electronic components are capable of operating with higher efficiencies or under higher temperatures as compared with conventional semiconductor components of materials such as Si and GaAs.

In order for an electronic component of a material such as GaN and SiC to operate at 200-250° C., for example, it is preferable to use a material having a melting point of 250° C. or higher as the material of the first binder of the electronic component. It is preferable to use a material having a melting point higher than the melting point (250° C. or higher) of the first binder as the material of the second binder for fixing the electronic component on the circuit board.

However, as described above, a practical lead-free solder having a melting point of 240-300° C. has not yet been discovered, and it is very difficult to find materials whose melting points are 250° C. or more and different from each other. Therefore, if materials of the same melting point can be used for the first and second binders, it is no longer necessary to find two materials whose melting points are 250° C. or more, but finding one such material is sufficient, thus facilitating the development of new materials.

In the present invention, even if materials of the same melting point are used for the first and second binders, it is possible to prevent the first binder from randomly flowing out during the mounting process. Thus, the employment of the present invention facilitates the development of new materials.

Note that according to the present invention, it is possible to prevent the first binder from randomly flowing out during the mounting process of mounting an electronic component on a circuit board by the second binder using the reflow method, as described above, and the present invention is therefore useful for electronic components to be mounted on circuit boards.

What is claimed is:

1. An electronic component mounted on a circuit board comprising:
    a substrate;
    a semiconductor chip fixed on the substrate by a first binder; and
    an encapsulation resin for encapsulating the substrate and the semiconductor chip, wherein
    the substrate includes a through hole running through the substrate from a portion of a principal surface of the substrate where the first binder is present toward a side surface of the substrate,
    the substrate includes a lower substrate, at least one middle substrate formed on the lower substrate, and an upper substrate formed on an uppermost one of the at least one middle substrate,
    the through hole includes a first hole portion, and a second hole portion one end of which is connected to the first hole portion,
    the first hole portion runs through the upper substrate, the second hole portion is provided in one of the at least one middle substrate, and an open end thereof is at a side surface of the one of the at least one middle substrate, and the first binder is exposed to ambient air via the through hole.

2. The electronic component of claim 1, further comprising an electrode pad provided on the substrate and electrically connected to the semiconductor chip by a thin metal wire, wherein the second hole portion is provided in a portion of the substrate other than portions thereof under the electrode pad.

3. The electronic component of claim 1, wherein the first hole portion, or the first hole portion and a portion of the second hole portion, is filled with a portion of the first binder.

4. The electronic component of claim 1, wherein a material of the first binder is a lead-free solder.

5. The electronic component of claim 1, wherein the electronic component is mounted on the circuit board by a second binder, and a melting point of the first binder is equal to or lower than a melting point of the second binder.

6. The electronic component of claim 1, wherein a portion of the through hole closer to the principal surface of the substrate is filled with a portion of the first binder.

7. The electronic component of claim 1, wherein the through hole extends to the side surface of the substrate so as to expose the first binder to the ambient air therefrom.

8. The electronic component of claim 5, wherein a material of the second binder is a lead-free solder.

* * * * *